United States Patent
Ahn et al.

(10) Patent No.: US 7,510,983 B2
(45) Date of Patent: Mar. 31, 2009

(54) IRIDIUM/ZIRCONIUM OXIDE STRUCTURE

(75) Inventors: Kie Y. Ahn, Chappaqua, NY (US);
Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 610 days.

(21) Appl. No.: 11/152,759

(22) Filed: Jun. 14, 2005

(65) Prior Publication Data
US 2006/0281330 A1    Dec. 14, 2006

(51) Int. Cl.
H01L 21/469    (2006.01)
H01L 21/31    (2006.01)

(52) U.S. Cl. ............... 438/783; 257/310; 257/E21.274; 438/785

(58) Field of Classification Search .................. 257/310, 257/E21.274; 438/783, 785
See application file for complete search history.

(56) References Cited

U.S. PATENT DOCUMENTS

| | | | |
|---|---|---|---|
| 6,010,969 A | 1/2000 | Vaartstra |
| 6,063,705 A | 5/2000 | Vaartstra |
| 6,141,238 A | 10/2000 | Forbes et al. |
| 6,191,470 B1 | 2/2001 | Forbes et al. |
| 6,217,645 B1 | 4/2001 | Vaartstra |
| 6,225,237 B1 | 5/2001 | Vaartstra |
| 6,249,460 B1 | 6/2001 | Forbes et al. |
| 6,273,951 B1 | 8/2001 | Vaartstra |
| 6,274,937 B1 | 8/2001 | Ahn et al. |
| 6,297,103 B1 | 10/2001 | Ahn et al. |
| 6,329,286 B1 | 12/2001 | Vaartstra |
| 6,337,805 B1 | 1/2002 | Forbes et al. |
| 6,350,704 B1 | 2/2002 | Ahn et al. |
| 6,368,398 B2 | 4/2002 | Vaartstra |
| 6,368,518 B1 | 4/2002 | Vaartstra |
| 6,426,292 B2 | 7/2002 | Vaartstra |
| 6,445,023 B1 | 9/2002 | Vaartstra et al. |
| 6,455,717 B1 | 9/2002 | Vaartstra |
| 6,456,535 B2 | 9/2002 | Forbes et al. |
| 6,495,436 B2 | 12/2002 | Ahn et al. |
| 6,514,820 B2 | 2/2003 | Ahn et al. |
| 6,514,828 B2 | 2/2003 | Ahn et al. |
| 6,534,420 B2 | 3/2003 | Ahn et al. |

(Continued)

FOREIGN PATENT DOCUMENTS

JP    2001044420    *    2/2001

OTHER PUBLICATIONS

Aaltonen, Titta , et al., "Atomic Layer Deposition of Iridium Thin Films", *Journal of the Electrochemical Society*, 151(8), (2004), G489-G492.

(Continued)

*Primary Examiner*—Asok K Sarkar
(74) *Attorney, Agent, or Firm*—Schwegman, Lundberg & Woessner, P.A.

(57) ABSTRACT

Embodiments of an electronic apparatus and embodiments for methods of forming the electronic apparatus include a conductive layer having an iridium-based layer, where the conductive layer is disposed on a dielectric layer containing zirconium oxide. In various embodiments, each of the zirconium oxide layer and the iridium-based layer may be structured as one or more monolayers. In various embodiments, each of the iridium-based layer and the zirconium oxide layer may be formed using atomic layer deposition.

74 Claims, 3 Drawing Sheets

U.S. PATENT DOCUMENTS

| | | |
|---|---|---|
| 6,544,846 B2 | 4/2003 | Ahn et al. |
| 6,552,383 B2 | 4/2003 | Ahn et al. |
| 6,682,602 B2 | 1/2004 | Vaartstra |
| 6,710,538 B1 | 3/2004 | Ahn et al. |
| 6,720,221 B1 | 4/2004 | Ahn et al. |
| 6,730,163 B2 | 5/2004 | Vaartstra |
| 6,730,164 B2 | 5/2004 | Vaartstra et al. |
| 6,731,531 B1 | 5/2004 | Forbes et al. |
| 6,734,510 B2 | 5/2004 | Forbes et al. |
| 6,737,740 B2 | 5/2004 | Forbes et al. |
| 6,767,795 B2 | 7/2004 | Ahn et al. |
| 6,774,050 B2 | 8/2004 | Ahn et al. |
| 6,784,049 B2 | 8/2004 | Vaartstra |
| 6,787,413 B2 | 9/2004 | Ahn |
| 6,794,255 B1 | 9/2004 | Forbes et al. |
| 6,794,284 B2 | 9/2004 | Vaartstra |
| 6,794,709 B2 | 9/2004 | Ahn et al. |
| 6,803,326 B2 | 10/2004 | Ahn et al. |
| 6,812,137 B2 | 11/2004 | Forbes et al. |
| 6,812,513 B2 | 11/2004 | Geusic et al. |
| 6,828,656 B2 | 12/2004 | Forbes et al. |
| 6,833,285 B1 | 12/2004 | Ahn et al. |
| 6,833,308 B2 | 12/2004 | Ahn et al. |
| 6,835,111 B2 | 12/2004 | Ahn et al. |
| 6,844,203 B2 | 1/2005 | Ahn et al. |
| 6,858,865 B2 | 2/2005 | Ahn et al. |
| 6,863,725 B2 | 3/2005 | Vaartstra et al. |
| 6,890,843 B2 | 5/2005 | Forbes et al. |
| 6,893,984 B2 | 5/2005 | Ahn et al. |
| 6,900,122 B2 | 5/2005 | Ahn et al. |
| 6,921,702 B2 | 7/2005 | Ahn et al. |
| 6,953,730 B2 | 10/2005 | Ahn et al. |
| 6,958,300 B2 | 10/2005 | Vaartstra et al. |
| 6,960,538 B2 | 11/2005 | Ahn et al. |
| 6,967,159 B2 | 11/2005 | Vaartstra |
| 6,984,592 B2 | 1/2006 | Vaartstra |
| 6,989,573 B2 | 1/2006 | Ahn et al. |
| 6,995,081 B2 | 2/2006 | Vaartstra |
| 7,030,042 B2 | 4/2006 | Vaartstra et al. |
| 7,041,609 B2 | 5/2006 | Vaartstra |
| 7,074,380 B2 * | 7/2006 | Iwaki et al. .............. 423/447.3 |
| 7,077,902 B2 | 7/2006 | Vaartstra |
| 7,087,481 B2 | 8/2006 | Vaartstra et al. |
| 7,112,485 B2 | 9/2006 | Vaartstra |
| 7,115,166 B2 | 10/2006 | Vaartstra et al. |
| 7,115,528 B2 | 10/2006 | Vaartstra et al. |
| 7,115,566 B2 | 10/2006 | Vaartstra et al. |
| 7,122,464 B2 | 10/2006 | Vaartstra |
| 7,125,815 B2 | 10/2006 | Vaartstra |
| 7,196,007 B2 | 3/2007 | Vaartstra |
| 7,250,367 B2 | 7/2007 | Vaartstra et al. |
| 7,253,122 B2 | 8/2007 | Vaartstra |
| 7,271,077 B2 | 9/2007 | Vaartstra et al. |
| 7,294,556 B2 | 11/2007 | Vaartstra |
| 7,300,870 B2 | 11/2007 | Vaartstra |
| 7,332,442 B2 | 2/2008 | Vaartstra et al. |
| 7,374,617 B2 | 3/2008 | Vaartstra |
| 7,368,402 B2 | 5/2008 | Vaartstra |
| 7,410,918 B2 | 8/2008 | Vaartstra |
| 2001/0042505 A1 | 11/2001 | Vaartstra |
| 2001/0053096 A1 | 12/2001 | Forbes et al. |
| 2001/0053577 A1 | 12/2001 | Forbes et al. |
| 2002/0001219 A1 | 1/2002 | Forbes et al. |
| 2002/0004276 A1 | 1/2002 | Ahn et al. |
| 2002/0004277 A1 | 1/2002 | Ahn et al. |
| 2002/0053869 A1 | 5/2002 | Ahn et al. |
| 2002/0105087 A1 | 8/2002 | Forbes et al. |
| 2002/0130378 A1 | 9/2002 | Forbes et al. |
| 2002/0135048 A1 | 9/2002 | Ahn et al. |
| 2002/0167057 A1 | 11/2002 | Ahn et al. |
| 2002/0175423 A1 | 11/2002 | Forbes et al. |
| 2002/0190294 A1 | 12/2002 | Iizuka et al. |
| 2002/0192974 A1 | 12/2002 | Ahn et al. |
| 2002/0192975 A1 | 12/2002 | Ahn |
| 2003/0017717 A1 | 1/2003 | Ahn |
| 2003/0043637 A1 | 3/2003 | Forbes et al. |
| 2003/0045060 A1 | 3/2003 | Ahn |
| 2003/0045078 A1 | 3/2003 | Ahn et al. |
| 2003/0119246 A1 | 6/2003 | Ahn |
| 2003/0119291 A1 | 6/2003 | Ahn et al. |
| 2003/0132491 A1 | 7/2003 | Ahn |
| 2003/0136995 A1 | 7/2003 | Geusic et al. |
| 2003/0139039 A1 | 7/2003 | Ahn et al. |
| 2003/0148627 A1 | 8/2003 | Aoki et al. |
| 2003/0157764 A1 | 8/2003 | Ahn et al. |
| 2003/0176065 A1 | 9/2003 | Vaartstra |
| 2003/0200917 A1 | 10/2003 | Vaartstra |
| 2003/0207032 A1 | 11/2003 | Ahn et al. |
| 2003/0207540 A1 | 11/2003 | Ahn et al. |
| 2003/0207566 A1 | 11/2003 | Forbes et al. |
| 2003/0228747 A1 | 12/2003 | Ahn et al. |
| 2004/0016944 A1 | 1/2004 | Ahn et al. |
| 2004/0033681 A1 | 2/2004 | Ahn et al. |
| 2004/0033701 A1 | 2/2004 | Ahn et al. |
| 2004/0040494 A1 | 3/2004 | Vaartstra et al. |
| 2004/0040501 A1 | 3/2004 | Vaartstra |
| 2004/0043151 A1 | 3/2004 | Vaartstra |
| 2004/0043541 A1 | 3/2004 | Ahn et al. |
| 2004/0043569 A1 | 3/2004 | Ahn et al. |
| 2004/0043600 A1 | 3/2004 | Vaartstra |
| 2004/0043604 A1 | 3/2004 | Vaartstra |
| 2004/0043625 A1 | 3/2004 | Vaartstra et al. |
| 2004/0043630 A1 | 3/2004 | Vaartstra et al. |
| 2004/0043632 A1 | 3/2004 | Vaartstra |
| 2004/0043633 A1 | 3/2004 | Vaartstra |
| 2004/0043634 A1 | 3/2004 | Vaartstra |
| 2004/0043635 A1 | 3/2004 | Vaartstra |
| 2004/0043636 A1 | 3/2004 | Vaartstra et al. |
| 2004/0108587 A1 | 6/2004 | Chudzik et al. |
| 2004/0110348 A1 | 6/2004 | Ahn et al. |
| 2004/0110391 A1 | 6/2004 | Ahn et al. |
| 2004/0126954 A1 | 7/2004 | Vaartstra et al. |
| 2004/0144980 A1 | 7/2004 | Ahn et al. |
| 2004/0152254 A1 | 8/2004 | Vaartstra et al. |
| 2004/0164357 A1 | 8/2004 | Ahn et al. |
| 2004/0164365 A1 | 8/2004 | Ahn et al. |
| 2004/0169453 A1 | 9/2004 | Ahn et al. |
| 2004/0175882 A1 | 9/2004 | Ahn et al. |
| 2004/0178439 A1 | 9/2004 | Ahn et al. |
| 2004/0183108 A1 | 9/2004 | Ahn |
| 2004/0185630 A1 | 9/2004 | Forbes et al. |
| 2004/0187968 A1 | 9/2004 | Vaartstra |
| 2004/0189175 A1 | 9/2004 | Ahn et al. |
| 2004/0197946 A1 | 10/2004 | Vaartstra et al. |
| 2004/0214399 A1 | 10/2004 | Ahn et al. |
| 2004/0217478 A1 | 11/2004 | Yamamoto et al. |
| 2004/0219746 A1 | 11/2004 | Vaartstra et al. |
| 2004/0222476 A1 | 11/2004 | Ahn et al. |
| 2004/0248398 A1 | 12/2004 | Ahn et al. |
| 2004/0262700 A1 | 12/2004 | Ahn et al. |
| 2005/0009266 A1 | 1/2005 | Vaartstra |
| 2005/0009368 A1 | 1/2005 | Vaartstra |
| 2005/0019978 A1 | 1/2005 | Vaartstra et al. |
| 2005/0020017 A1 | 1/2005 | Ahn et al. |
| 2005/0023594 A1 | 2/2005 | Ahn et al. |
| 2005/0023625 A1 | 2/2005 | Ahn et al. |
| 2005/0023626 A1 | 2/2005 | Ahn et al. |
| 2005/0023627 A1 | 2/2005 | Ahn et al. |
| 2005/0023664 A1 | 2/2005 | Chudzik et al. |
| 2005/0026360 A1 | 2/2005 | Geusic et al. |
| 2005/0028733 A1 | 2/2005 | Vaartstra |
| 2005/0029545 A1 | 2/2005 | Forbes et al. |
| 2005/0029547 A1 | 2/2005 | Ahn et al. |
| 2005/0029604 A1 | 2/2005 | Ahn et al. |

| | | | |
|---|---|---|---|
| 2005/0029605 A1 | 2/2005 | Ahn et al. | |
| 2005/0032292 A1 | 2/2005 | Ahn et al. | |
| 2005/0032360 A1 | 2/2005 | Vaartstra | |
| 2005/0037563 A1 | 2/2005 | Ahn | |
| 2005/0051824 A1 | 3/2005 | Iizuka et al. | |
| 2005/0054165 A1 | 3/2005 | Ahn et al. | |
| 2005/0077519 A1 | 4/2005 | Ahn et al. | |
| 2005/0124171 A1 | 6/2005 | Vaartstra | |
| 2005/0124175 A1 | 6/2005 | Ahn et al. | |
| 2005/0136689 A9 | 6/2005 | Vaartstra | |
| 2005/0160981 A9 | 7/2005 | Vaartstra et al. | |
| 2005/0221006 A1 | 10/2005 | Vaartstra | |
| 2005/0266700 A1* | 12/2005 | Jursich et al. | 438/785 |
| 2005/0287804 A1 | 12/2005 | Vaartstra | |
| 2005/0287819 A1 | 12/2005 | Vaartstra et al. | |
| 2006/0024975 A1 | 2/2006 | Ahn et al. | |
| 2006/0043504 A1 | 3/2006 | Ahn et al. | |
| 2006/0046521 A1 | 3/2006 | Vaartstra et al. | |
| 2006/0046522 A1 | 3/2006 | Ahn et al. | |
| 2006/0048711 A1 | 3/2006 | Vaartstra | |
| 2006/0172485 A1 | 8/2006 | Vaartstra | |
| 2006/0231017 A1 | 10/2006 | Vaartstra | |
| 2006/0252244 A1 | 11/2006 | Vaartstra et al. | |
| 2006/0252279 A1 | 11/2006 | Vaartstra | |
| 2006/0258175 A1 | 11/2006 | Vaartstra et al. | |
| 2006/0261389 A1 | 11/2006 | Vaartstra | |
| 2006/0292788 A1 | 12/2006 | Vaartstra | |
| 2007/0006798 A1 | 1/2007 | Vaartstra et al. | |
| 2007/0144438 A1 | 6/2007 | Vaartstra | |
| 2007/0155190 A1 | 7/2007 | Vaartstra et al. | |
| 2007/0161260 A1 | 7/2007 | Vaartstra | |
| 2007/0166999 A1 | 7/2007 | Vaartstra | |
| 2007/0295273 A1 | 12/2007 | Vaartstra | |
| 2008/0064210 A1 | 3/2008 | Vaartstra | |
| 2008/0102629 A1 | 5/2008 | Vaartstra | |

OTHER PUBLICATIONS

Endo, Kazuhiko, et al., "Metal Organic Atomic Layer Deposition of High-k Gate Dielectrics Using Plasma Oxidation", *Japanese Journal of Applied Physics*, 42, (2003), L685-L687.

Gusev, E. P., et al., "Ultrathin high-K gate stacks for advanced CMOS devices", *IEEE Tech. Dig. Int. Electron Devices*, (2001), 451-454.

He, B., et al., "A 1.1 nm Oxide Equivalent Gate Insulator Formed Using TiO2 on Nitrided Silicon", *IEEE Tech. Dig. Int. Electron Device Meeting*, (1998), 1038-1040.

Ishii, Hiroyuki, et al., "Growth and electrical properties of atomic-layer deposited ZrO2/Si-nitride stack gate dielectrics", *Journal of Applied Physics*, 95(2), (Jan. 15, 2004), 536-542.

Jonsson, A. K., et al., "Dielectric Permittivity and Intercalation Parameters of Li Ion Intercalated Atomic Layer Deposited ZrO2", *Journal of the Electrochemical Society*, vol. 151, No. 3, (2004), F54-F58.

Lee, C. H., et al., "MOS Characteristics of Ultra Thin Rapid Thermal CVD ZrO2 and Zr Silicate Gate Dielectrics", *Electron Devices Meeting, 2000. IEDM Technical Digest. International*, (2000), 27-30.

Leskela, M, et al., "ALD precursor chemistry: Evolution and future challenges", *Journal de Physique IV (Proceedings)*, 9(8), (Sep. 1999), 837-852.

Ma, Yanjun, et al., "Zirconium oxide based gate dielectrics with equivalent oxide thickness of less than 1.0 nm and performance of submicron MOSFET using a nitride gate replacement process", *International Electron Devices Meeting 1999. Technical Digest*, (1999), 149-152.

Perkins, Charles M., et al., "Electrical and materials properties of ZrO2 gate dielectrics grown by atomic layer chemical vapor deposition", *Applied Physics Letters*, 78(16), (Apr. 2001), 2357-2359.

Sneh, Ofer, et al., "Thin film atomic layer deposition equipment for semiconductor processing", *Thin Solid Films*, 402(1-2), (Jan. 1, 2002), 248-261.

Stathis, James H., "Physical and Predictive Models of Ultrathin Oxide Reliability in CMOS Devices and Circuits", *IEEE Transactions on Device and Materials Reliability*, 1(1), (Mar. 2001), 43-59.

Suntola, T., "Atomic Layer Epitaxy", *Handbook of Crystal Growth, 3; Thin Films of Epitaxy, Part B: Growth Mechanics and Dynamics*, Amsterdam,(1994), 601-663.

Wilk, G D., et al., "Hafnium and zirconium silicates for advanced gate dielectrics", *Journal of Applied Physics*, 87(1), (Jan. 2000), 484-492.

Youm, Minsoo, et al., "Metal Oxide Semiconductor Field Effect Transistor Characteristics with Iridium Gate Electrode on Atomic Layer Deposited ZrO2 High-k Dielectrics", *Jpn. J. Appl. Phys.*, vol. 42, (Aug. 2003), 5010-5013.

Ahn, Kie Y., "ALD of Amorphous Lanthanide Doped Tiox Films", U.S. Appl. No. 11/092,072, filed Mar. 29, 2005, 04-1321.

Ahn, Kie Y., "Atomic Layer Deposited Hafnium Tantalum Oxide Dielectrics", U.S. Appl. No. 11/029,757, filed Jan. 5, 2005, 04-0902.

Ahn, Kie Y., "Atomic Layer Deposited Lanthanum Hafnium Oxide Dielectrics", U.S. Appl. No. 11/010,529, filed Dec. 13, 2004, 04-0802.

Ahn, Kie Y., "Atomic Layer Deposited Titanium Silicon Oxide Films", U.S. Appl. No. 11/093,104, filed Mar. 29, 2005, 05-0019.

Ahn, Kie Y., "Atomic Layer Deposited Zirconium Silicon Oxide Films", U.S. Appl. No. 11/117,121, filed Apr. 28, 2005, 05-0061.

Ahn, Kie Y., "Atomic Layer Deposition of a Ruthenium Layer to a Lanthanide Oxide Dielectric Layer", U.S. Appl. No. 11/117,125, filed Apr. 28, 2005, 05-0116.

Ahn, Kie Y., "Atomic Layer Deposition of $CeO_2/Al_2O_3$ Films as Gate Dielectrics", U.S. Appl. No. 11/055,380, filed Feb. 10, 2005, 04-1094.

Ahn, Kie Y., "Atomic Layer Deposition of Dy-Doped $HfO_2$ Films as Gate Dielectrics", U.S. Appl. No. 11/053,577, filed Feb. 8, 2005, 04-1179.

Ahn, Kie Y., "Hafnium Titanium Oxide Films", U.S. Appl. No. 11/140,643, filed May 27, 2005, 05-0172.

Ahn, Kie Y., "Hybrid ALD-CVD of $Pr_xO_y/ZrO_2$ Films as Gate Dielectrics", U.S. Appl. No. 11/010,766, filed Dec. 13, 2004, 04-0997.

Ahn, Kie Y., "Ruthenium Gate for a Lanthanide Oxide Dielectric Layer", U.S. Appl. No. 10/926,812, filed Aug. 26, 2004, 04-0538.

Suntola, Tuomo, "Atomic layer epitaxy" *Thin Solid Films*, 216(1), (Aug. 28, 1992),84-89.

Wilk, G. D., "High-K gate dielectrics: Current status and materials properties considerations", *Journal of Applied Physics*, 89(10), (May 2001),5243-5275.

* cited by examiner

IRIDIUM/ZIRCONIUM OXIDE STRUCTURE

TECHNICAL FIELD

This application relates generally to electronic systems, semiconductor devices, and device fabrication.

BACKGROUND

The semiconductor device industry has a market driven need to reduce the size of devices such as transistors. To reduce transistor size, the thickness of a silicon dioxide, $SiO_2$, gate dielectric is typically reduced in proportion to the shrinkage of the gate length. A goal is to fabricate increasingly smaller and more reliable integrated circuits (ICs) for use in products such as processor chips, mobile telephones, and memory devices such as dynamic random access memories (DRAMs).

Currently, the semiconductor industry relies on the ability to reduce or scale the dimensions of its basic devices; primarily, the silicon based metal oxide semiconductor field effect transistor (MOSFET) or variations thereof. This device scaling includes scaling the gate dielectric, which has primarily been fabricated using silicon dioxide. A thermally grown amorphous $SiO_2$ layer provides an electrically and thermodynamically stable material, where the interface of the $SiO_2$ layer with underlying silicon provides a high quality interface as well as superior electrical isolation properties. However, increased scaling and other requirements in microelectronic devices have created the need to use other dielectric materials as dielectrics in these microelectronic devices.

DETAILED DESCRIPTION

Figure 1:
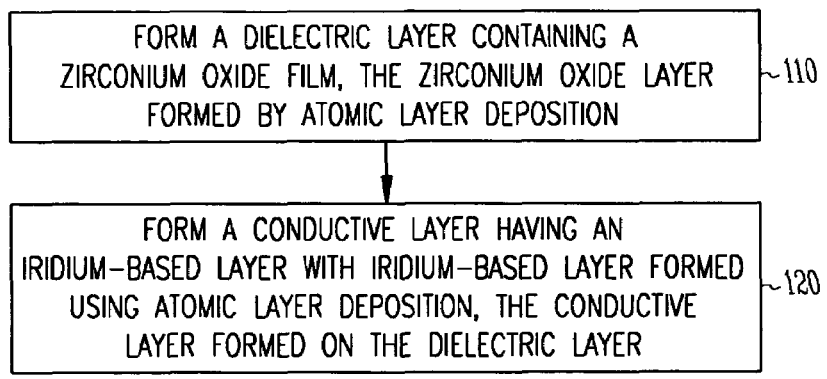
FIG. 1 illustrates a flow diagram of elements for an embodiment of a method to form an iridium/zirconium oxide structure using atomic layer deposition.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms "wafer" and "substrate" used in the following description include any structure having an exposed surface with which to form an integrated circuit (IC) structure. The term "substrate" is understood to include semiconductor wafers. The term "substrate" is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors, and the term insulator or dielectric is defined generally to include any material that is less electrically conductive than the materials referred to as conductors, as is known by those skilled in the art. The following detailed description is, therefore, not to be taken in a limiting sense, and the scope of the present invention is defined only by the appended claims, along with the full scope of equivalents to which such claims are entitled.

A gate dielectric in a transistor has both a physical gate dielectric thickness and an equivalent oxide thickness ($t_{eq}$). The equivalent oxide thickness quantifies the electrical properties, such as capacitance, of the gate dielectric in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale the gate dielectric equivalent oxide thickness to under 10 Å, the physical thickness for a $SiO_2$ layer used for a gate dielectric would need to be approximately 4 to 7 Å.

Additional requirements on a $SiO_2$ layer would depend on the gate electrode used in conjunction with the $SiO_2$ gate dielectric. Using a conventional polysilicon gate would result in an additional increase in $t_{eq}$ for the $SiO_2$ layer, though this additional thickness may be eliminated by using a metal gate electrode. Thus, future devices would be designed towards a physical $SiO_2$ gate dielectric layer of about 5 Å or less. Such a small thickness for a $SiO_2$ oxide layer creates additional problems.

Silicon dioxide is used as a gate dielectric, in part, due to its electrical isolation properties in a $SiO_2$—Si based structure. This electrical isolation is due to the relatively large band gap of $SiO_2$ (8.9 eV), making it a good insulator from electrical conduction. Significant reductions in its band gap would eliminate it as a material for a gate dielectric. As the thickness of a $SiO_2$ layer decreases, the number of atomic layers, or monolayers of the material in the thickness decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers will not form a full band gap. The lack of a full band gap in a $SiO_2$ gate dielectric may cause an effective short between an underlying Si channel and an overlying polysilicon gate. This undesirable property sets a limit on the physical thickness to which a $SiO_2$ layer may be scaled. The minimum thickness due to this monolayer effect is thought to be about 7-8 Å. Therefore, for future devices to have a $t_{eq}$ less than about 10 Å, dielectrics other than $SiO_2$ should be considered for use as a gate dielectric.

For a typical dielectric layer used as a gate dielectric, the capacitance is determined as one for a parallel plate capacitance: $C = \kappa \epsilon_0 A/t$, where $\kappa$ is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $\kappa_{ox} = 3.9$, as $$t = (\kappa/\kappa_{ox})t_{eq} = (\kappa/3.9)t_{eq}.$$

Thus, materials with a dielectric constant greater than that of $SiO_2$, 3.9, will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced equivalent oxide thickness for transistors can be realized by using dielectric materials with higher dielectric constants than $SiO_2$.

The thinner equivalent oxide thickness required for lower transistor operating voltages and smaller transistor dimensions may be realized by a significant number of materials, but additional fabricating requirements make determining a suitable replacement for $SiO_2$ difficult. The current view for the microelectronics industry is still for Si based devices. This requires that the gate dielectric employed be grown on a silicon substrate or silicon layer, which places significant constraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness, t, of the dielectric being formed, written as $$t_{eq} = t_{SiO_2} + (\kappa_{ox}/\kappa)t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer interfacing with the silicon layer should provide a high quality interface to maintain a high channel carrier mobility.

One of the advantages of using $SiO_2$ as a gate dielectric has been that the formation of the $SiO_2$ layer results in an amorphous gate dielectric. Having an amorphous structure for a gate dielectric provides for reducing problems of leakage current associated with grain boundaries in polycrystalline gate dielectrics that provide high leakage paths. Additionally, grain size and orientation changes throughout a polycrystalline gate dielectric can cause variations in the film's dielectric constant, along with uniformity and surface topography problems. Typically, materials having the advantage of a high dielectric constant relative to $SiO_2$ also have the disadvantage of a crystalline form, at least in a bulk configuration. The best candidates for replacing $SiO_2$ as a gate dielectric are those that can be fabricated as a thin layer with an amorphous form and that have high dielectric constants.

Materials for use as dielectrics in electronic devices may include high-κ materials. High-κ materials include materials having a dielectric constant greater than silicon dioxide, for example, dielectric materials having a dielectric constant greater than about twice the dielectric constant of silicon dioxide. Examples of such high-κ materials include $HfO_2$, $ZrO_2$, $Ta_2O_5$, $TiO_2$, $La_2O_3$, $Al_2O_3$, $Y_2O_3$, metal silicates, and metal aluminates. Other characteristics for choosing a silicon oxide replacement include using materials that provide a sharp interface with silicon, which may provide a low density of interface states, a large energy barrier from the conduction band to the Fermi level of the gate electrode to maintain leakage current at acceptable levels, and structural stability with contact electrodes and substrate material during device processing steps performed after providing the dielectric layer. In addition to having low leakage current properties, a silicon oxide replacement should be able to be implemented in a complementary metal oxide semiconductor (CMOS) fabrication process providing equivalent capacitance, performance, and reliability at a level approaching or exceeding that of silicon oxide. Many of these high-κ materials form an interfacial layer on silicon during formation. The interfacial layer may be a silicate layer that would increase the equivalent thickness associated with the high-κ material. Depending on the high-κ material, the formation of an interfacial layer may have an adverse effect on leakage current, charge trapping, and hysteresis in electrical properties.

Another consideration for selecting the material and method for forming a dielectric film for use in electronic devices and systems concerns the roughness of a dielectric film on a substrate. Surface roughness of the dielectric film has a significant effect on the electrical properties of the gate oxide, and the resulting operating characteristics of the transistor. The leakage current through a physical 1.0 nm gate oxide increases by a factor of 10 for every 0.1 increase in the root-mean-square (RMS) roughness.

During a conventional sputtering deposition process stage, particles of the material to be deposited bombard the surface at a high energy. When a particle hits the surface, some particles adhere, and other particles cause damage. High energy impacts remove body region particles, creating pits. The surface of such a deposited layer can have a rough contour due to the rough interface at the body region.

In an embodiment, a zirconium oxide dielectric film having a substantially smooth surface relative to other processing techniques may be formed using atomic layer deposition (ALD). Embodiments of dielectric layers containing an atomic layer deposited zirconium oxide film have a larger dielectric constant than silicon dioxide. Such dielectric layers provide a significantly thinner equivalent oxide thickness compared with a silicon oxide layer having the same physical thickness. Alternatively, such dielectric layers provide a significantly thicker physical thickness than a silicon oxide layer having the same equivalent oxide thickness. This increased physical thickness aids in reducing leakage current. Further, forming such a dielectric film using atomic layer deposition can provide for controlling transitions between material layers. As a result of such control, atomic layer deposited zirconium oxide dielectric films can have an engineered transition with a substrate surface.

In an embodiment, an iridium layer having a substantially smooth surface relative to other processing techniques may be formed using atomic layer deposition. Forming such a metal layer using atomic layer deposition can provide for controlling transitions between material layers. As a result of such control, atomic layer deposited iridium layers can have an engineered transition with a surface onto which they are deposited. In an embodiment, an iridium layer formed by ALD is oxidized to form a layer of conductive iridium oxide on the iridium layer. In an embodiment, an iridium layer formed by ALD may be oxidized to convert the layer to a conductive iridium oxide layer.

ALD, also known as atomic layer epitaxy (ALE), is a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber may be purged with a gas, where the purging gas may be an inert gas. Between the pulses, the reaction chamber may be evacuated. Between the pulses, the reaction chamber may be purged with a gas and evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favourable precursor chemistry where the precursors adsorb and react with each other aggressively on the substrate, one ALD cycle can be performed in less than one second in properly designed flow type reaction chambers. Typically, precursor pulse times range from about 0.5 sec to about 2 to 3 seconds. Pulse times for purging gases may be significantly larger, for example, pulse times of about 5 to about 30 seconds.

In ALD, the saturation of all the reaction and purging phases makes the growth self-limiting. This self-limiting growth results in large area uniformity and conformality, which has applications for such cases as planar substrates, deep trenches, and in the processing of porous silicon and high surface area silica and alumina powders. ALD may provide control of film thickness in a straightforward manner by controlling the number of growth cycles.

The precursors used in an ALD process may be gaseous, liquid or solid. However, liquid or solid precursors should be volatile. The vapor pressure should be high enough for effective mass transportation. In addition, solid and some liquid precursors may need to be heated and introduced through heated tubes to the substrates inside the reaction chamber. The necessary vapor pressure should be reached at a temperature below the substrate temperature to avoid the condensation of the precursors on the substrate. Due to the self-limiting growth mechanisms of ALD, relatively low vapor pressure solid precursors can be used, though evaporation rates may vary somewhat during the process because of changes in their surface area.

There are several other characteristics for precursors used in ALD. The precursors should be thermally stable at the substrate temperature, because their decomposition may destroy the surface control and accordingly the advantages of the ALD method that relies on the reaction of the precursor at the substrate surface. A slight decomposition, if slow compared to the ALD growth, can be tolerated.

The precursors should chemisorb on or react with the surface, though the interaction between the precursor and the surface as well as the mechanism for the adsorption is different for different precursors. The molecules at the substrate surface should react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction should be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. A metal precursor reaction at the substrate is typically followed by an inert gas pulse to remove excess precursor and by-products from the reaction chamber prior to pulsing the next precursor of the fabrication sequence.

By RS-ALD, films can be layered in equal metered sequences that may be identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle can be realized.

Processing by RS-ALD provides continuity at an interface avoiding poorly defined nucleating regions that are typical for chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with a resolution of one to two monolayers. RS-ALD processes allow for deposition control on the order of monolayers and the ability to deposit monolayers of amorphous films.

Herein, a sequence refers to the ALD material formation based on an ALD reaction of a precursor with its reactant precursor. For example, forming zirconium oxide from a $ZrI_4$ precursor and $H_2O_2$, as its reactant precursor, forms an embodiment of a zirconium/oxygen sequence, which can also be referred to as a zirconium sequence. In various ALD processes that form an oxide or a compound that contains oxygen, a reactant precursor that contains oxygen is used to supply oxygen. Herein, a precursor that contains oxygen and that supplies oxygen to be incorporated in the ALD compound formed, which may be used in an ALD process with precursors supplying the other elements in the ALD compound, is referred to as an oxygen reactant precursor. In the above example, $H_2O_2$ is an oxygen reactant precursor. A cycle of a sequence may include pulsing a precursor, pulsing a purging gas for the precursor, pulsing a reactant precursor, and pulsing the reactant precursor's purging gas. Further, in forming a layer of a metal species, an ALD sequence may deal with reacting a precursor containing the metal species with a substrate surface. A cycle for such a metal forming sequence may include pulsing a purging gas after pulsing the precursor containing the metal species to deposit the metal. Additionally, deposition of a semiconductor material may be realized in a manner similar to forming a layer of a metal, given the appropriate precursors for the semiconductor material.

In an ALD formation of a compound having more than two elements, a cycle may include a number of sequences to provide the elements of the compound. For example, a cycle for an ALD formation of an $ABO_x$ compound may include sequentially pulsing a first precursor/a purging gas for the first precursor/a first reactant precursor/the first reactant precursor's purging gas/a second precursor/a purging gas for the second precursor/a second reactant precursor/the second reactant precursor's purging gas, which may be viewed as a cycle having two sequences. In an embodiment, a cycle may include a number of sequences for element A and a different number of sequences for element B. There may be cases in which ALD formation of an $ABO_x$ compound uses one precursor that contains the elements A and B, such that pulsing the AB containing precursor followed by its reactant precursor onto a substrate may include a reaction that deposits $ABO_x$ on the substrate to provide an AB/oxygen sequence. A cycle of an AB/oxygen sequence may include pulsing a precursor containing A and B, pulsing a purging gas for the precursor, pulsing a reactant precursor to the A/B precursor, and pulsing a purging gas for the reactant precursor. A cycle may be repeated a number of times to provide a desired thickness of the compound. In an embodiment, a layer of zirconium oxide is formed on a substrate mounted in a reaction chamber using ALD in repetitive zirconium sequences using precursor gases individually pulsed into the reaction chamber. Formation of the zirconium oxide film may be followed by formation of an iridium layer on the zirconium oxide film using ALD in repetitive iridium sequences using precursor gases individually pulsed into the reaction chamber. Alternatively, solid or liquid precursors can be used in an appropriately designed reaction chamber.

In various embodiments, commercially available ALD systems may be used to form a conductive layer having a conductive iridium-based layer on a dielectric layer containing a zirconium oxide film. Using ALD techniques, an iridium layer may be formed contacting a zirconium oxide film. The use, construction and fundamental operation of reaction chambers for atomic layer deposition of films are understood by those of ordinary skill in the art of semiconductor fabrication. Embodiments may be practiced on a variety of such reaction chambers or custom reaction chambers without undue experimentation. Such procedures allow for the individual precursors, reactant precursors, and purging gases to be applied independently to a substrate. Systems may include vacuum pumps, exhaust pumps, or other means to remove excess precursor gases, excess reactant precursor gases, purging gases, and by-product gases from the system at the end of a purge or at the end of each gas flow.

In an embodiment, a dielectric layer containing a zirconium oxide film may be formed in an integrated circuit, where the zirconium oxide film may be formed by atomic layer deposition. In an embodiment, the dielectric layer may be formed substantially as a zirconium oxide layer. In an embodiment, a dielectric layer may be formed as a combination of one or more zirconium oxide films and layers of other dielectric materials, such as other metal oxides, insulating nitrides, and insulating oxynitrides. In an embodiment, a conductive iridium-based layer may be disposed on a zirconium oxide film as an electrode, a gate, or a direct conductive contact depending on the application of the zirconium oxide dielectric as a component of an electronic device. An iridium-based material includes a material substantially of iridium, iridium oxide, or a combination of iridium and iridium oxide. An atomic layer deposited conductive iridium-based gate contacting an atomic layer deposited zirconium oxide dielectric layer may be applied to fabrication processes of Damascene gates, dual gate MOSFETs, and other structures.

In an embodiment, a method for forming an electronic apparatus includes forming a dielectric layer containing a zirconium oxide film in an integrated circuit, where the $ZrO_x$ film may be structured as one or more monolayers. $ZrO_x$ may include stoichiometric zirconium oxide. $ZrO_x$ may include non-stoichiometric zirconium oxide. $ZrO_x$ may include a combination of stoichiometric zirconium oxide and non-stoichiometric zirconium oxide. The thickness of the $ZrO_x$ film may range from a monolayer to thousands of angstroms depending on the application. The zirconium oxide film may be formed by atomic layer deposition. In an embodiment, the dielectric layer may be formed substantially as the zirconium oxide film. In an embodiment, a method for forming an electronic apparatus includes forming a conductive layer having a conductive iridium-based layer, where the conductive iridium-based layer may be structured as one or more monolayers. The thickness of the iridium-based layer may range from a monolayer to thousands of angstroms depending on the application. The iridium-based layer may be configured as an iridium layer, a conductive iridium oxide layer, or a combination of metal iridium and conductive iridium oxide. In various non-limiting embodiments, a dielectric layer containing a zirconium oxide film structured as one or more monolayers and contacting a conductive layer having an iridium-based layer structured as one or more monolayers may be formed as a dielectric in a capacitor in an integrated circuit, as a dielectric in a capacitor of a dynamic random access memory, as a gate insulator in a CMOS transistor, as a tunnel gate insulator in a flash memory device, as an inter-gate insulator in a flash memory device, as a dielectric region in a non-volatile read only memory (NROM) flash memory, and as a nanolaminate dielectric in a NROM flash memory. Embodiments of a dielectric layer containing a zirconium oxide film and contacting a conductive layer having a conductive iridium-based layer may be an integral part of a wide variety of electronic devices in electronic apparatus and systems, according to the teachings herein.

FIG. 1 illustrates a flow diagram of elements for an embodiment of a method to form a dielectric layer containing a zirconium oxide film and a conductive layer contacting the dielectric layer, where the conductive layer contains an iridium-based layer. Initially, a substrate on which the dielectric layer is to be deposited is prepared. The substrate may typically be a silicon or silicon-containing material. In other embodiments, germanium, gallium arsenide, silicon-on-sapphire substrates, or other suitable substrates may be used. A preparation process may include cleaning the substrate and forming layers and regions of the substrate, such as drains and sources of a metal oxide semiconductor (MOS) transistor, prior to forming a dielectric. In an embodiment, the substrate is cleaned to provide an initial substrate depleted of its native oxide. In an embodiment, the initial substrate is cleaned also to provide a hydrogen-terminated surface. In an embodiment, a silicon substrate undergoes a final hydrofluoric (HF) rinse prior to ALD processing to provide the silicon substrate with a hydrogen-terminated surface without a native silicon oxide layer.

Cleaning immediately preceding atomic layer deposition aids in reducing an occurrence of silicon oxide as an interface between a silicon based substrate and a zirconium oxide dielectric formed using the atomic layer deposition process. The material composition of an interface layer and its properties are typically dependent on process conditions and the condition of the substrate before forming the dielectric layer. Though the existence of an interface layer may effectively reduce the dielectric constant associated with the dielectric layer and its substrate interface layer, a silicon oxide interface layer or other composition interface layer may improve the interface density, fixed charge density, and channel mobility of a device having this interface layer.

The sequencing of the formation of the regions of an electronic device being processed may follow typical sequencing that is generally performed in the fabrication of such a device as is well known to those skilled in the art. Included in the processing prior to forming a dielectric is the masking of substrate regions to be protected during the dielectric formation, as is typically performed in semiconductor fabrication. In an embodiment, the unmasked region includes a body region of a transistor; however, one skilled in the art will recognize that other semiconductor device structures may utilize this process.

At 110, a dielectric layer containing zirconium oxide film is formed. The zirconium oxide film may be formed by atomic layer deposition. Such a dielectric layer may be formed as an integral part of an electronic device in an integrated circuit. The dielectric layer may be configured substantially as the zirconium oxide film. Alternatively, the dielectric layer may be formed of multiple layers including at least one layer of zirconium oxide.

A number of precursors containing a zirconium may be used to form a zirconium oxide film on a substrate for an integrated circuit by ALD. In an embodiment, a precursor containing zirconium includes tetrakis(diethylamino) zirconium (TDEAZ). Oxygen may be used as its reactant precursor in a zirconium sequence with argon gas used as a pulsing gas after TDEAZ pulses and oxygen pulses. Various pulse times may be used in the zirconium/oxygen sequence including using equal pulse times, for example, using 5 seconds as a common pulse time. In an embodiment, oxygen plasma may be used as a reactant precursor. In an embodiment, the substrate temperature is maintained at about 350° C.

In an embodiment, a zirconium halide precursor may be used to form a zirconium oxide layer by ALD. $ZrCl_4$ may be used as a zirconium precursor. Water vapor may be used as a oxygen reactant. In an embodiment, the substrate temperature is maintained at about 300° C. Other zirconium halides, such as $ZrI_4$ may be used as a zirconium precursor in an ALD process.

In an embodiment, a precursor containing zirconium includes zirconium tertiary-butoxide $\{Zr(t-OC_4H_9)_4,$ (ZTB)$\}$. Water vapor may be used as a reactant precursor in a zirconium sequence. Oxygen plasma may be used as a reactant precursor in a zirconium sequence. Various pulse times may be used in the zirconium/oxygen sequence including using equal pulse times. ALD using ZTB may use longer pulse times, for example, pulse times in the range from 10 seconds to about 180 seconds. An inert gas may be used as a purging gas. In an embodiment, the substrate temperature is maintained at a temperature ranging from about 75° C. to about 400° C. However, use of the individual zirconium precursors is not limited to the temperature ranges of embodiments described herein.

Various oxidant reactant precursors may be used with different initial precursors, including, but not limited to, one or more of water, atomic oxygen, molecular oxygen, ozone, hydrogen peroxide, a water-hydrogen peroxide mixture, alcohol, or nitrous oxide. In various embodiments, nitrogen may be used as a purging gas and a carrier gas for a zirconium sequence. Alternatively, argon gas or other inert gas may be used as the purging gas. Excess precursor gas and reaction by-products may be removed by the purge gas. Excess precursor gas and reaction by-products may be removed by evacuation of the reaction chamber using various vacuum techniques. Excess precursor gas and reaction by-products may be removed by the purge gas and by evacuation of the reaction chamber.

After repeating the zirconium sequence for a selected number of cycles, a determination may be made as to whether the number of zirconium cycles equals a predetermined number to form the desired zirconium oxide film. If the total number of cycles to form the desired thickness has not been completed, a number of cycles for the zirconium sequence is repeated. If the total number of cycles to form the desired thickness has been completed, the dielectric film containing the zirconium oxide film may optionally be annealed. A zirconium oxide film processed at relatively low temperatures may provide an amorphous dielectric layer.

The thickness of a zirconium oxide film formed by atomic layer deposition may be determined by a fixed growth rate for the pulsing periods and precursors used, set at a value such as N nm/cycle, dependent upon the number of cycles of the zirconium sequence. For a desired zirconium oxide film thickness, t, in an application such as forming a gate dielectric of a MOS transistor, the ALD process is repeated for t/N total cycles. Once the t/N cycles have completed, no further ALD processing for the zirconium oxide film may be required.

A dielectric layer of substantially zirconium oxide may have a dielectric constant ranging from about 10 to about 25 depending on the formation of an interfacial layer, size effects associated with ultra-thin zirconium oxide layers, and other factors. In an embodiment, lithium is inserted into a zirconium oxide layer. The zirconium oxide layer with inserted lithium may exhibit an increase in dielectric constant relative to a similarly fabricated zirconium oxide layer without inserted lithium. In an embodiment, lithium ions may be inserted into a $ZrO_x$ film by an electrochemical process using a three-electrode configuration with the $ZrO_x$ film as an electrode and lithium foils as counter and reference electrodes. A galvanostatic intermittent titration technique (GITT) may be used to control the insertion process. Lithium may be inserted into a $ZrO_x$ film using other techniques such as ion implantation. Other elements may be used to enhance the dielectric properties of a $ZrO_x$ film including, but not limited to, hydrogen and potassium.

In an embodiment, a zirconium oxide film has a lithium content to provide enhanced dielectric properties. In an embodiment, a zirconium oxide film includes inserted lithium with a lithium to zirconium ratio less than about 0.10. In an embodiment, a zirconium oxide film includes inserted lithium with a lithium to zirconium ratio ranging from about 0.005 to about 0.035. In an embodiment, a zirconium oxide film includes inserted lithium with a lithium to zirconium ratio ranging from about 0.04 to about 0.1. At some lithium to zirconium ratios in the interval of about 0.035 to about 0.04 and below 0.0005, the amount of enhancement in dielectric constant may be significantly less than in other ranges of a lithium to zirconium ratio.

At 120, a conductive layer is formed on the dielectric layer, where the conductive layer has a conductive iridium-based layer. The conductive iridium-based layer may be formed using atomic layer deposition. The conductive layer may be deposited such that iridium contacts the zirconium oxide film. Typically, polysilicon is used to contact dielectric regions in electronic devices, such as polysilicon gate electrodes in a CMOS fabrication process. However, zirconium oxide may undergo a strong interaction with polysilicon during polysilicon deposition and post annealing. In an embodiment, an iridium-based material in contact with a zirconium oxide layer may prevent degradation of the $t_{eq}$ and leakage current properties of a zirconium oxide layer associated with a polysilicon contact to a zirconium oxide layer.

In an embodiment, a precursor containing iridium for use in an atomic layer deposition process to deposit iridium includes iridium acetylacetonate {Ir(CH$_3$COCHCOCH$_3$)$_3$, which may also be expressed as Ir(acac)$_3$ with acac=2,4-pentanedione}. Air may be used as a reactant precursor in an iridium sequence with an Ir(acac)$_3$ precursor. Various flow rates for these precursors may be used. In an embodiment, air may be flowed at a rate ranging from about 5 sccm to about 40 sccm. In an embodiment, pulse times for an Ir(acac)$_3$ and air precursors may range from about 0.5 seconds to about 2.5 seconds with purge pulses of 0.5 second. In an embodiment, nitrogen is used as a purge gas. In an embodiment, nitrogen may be flowed at about 400 sccm in a reactor having a pressure of about 10 mbar. Other inert gases may be used to purge the reaction region. In an embodiment, the substrate temperature is maintained between about 200° C. and about 400° C. Other temperatures, gas flow rates, and pressures may be used to provide an iridium layer by atomic layer deposition.

In various embodiments, nitrogen may be used as a purging gas and a carrier gas for a zirconium sequence. Alternatively, argon gas or other inert gas may be used as the purging gas. Excess precursor gas and reaction by-products may be removed by the purge gas. Excess precursor gas and reaction by-products may be removed by evacuation of the reaction chamber using various vacuum techniques. Excess precursor gas and reaction by-products may be removed by the purge gas and by evacuation of the reaction chamber.

After repeating the iridium sequence for a selected number of cycles, a determination may be made as to whether the number of iridium cycles equals a predetermined number to form the desired iridium layer. If the total number of cycles to form the desired thickness has not been completed, a number of cycles for the iridium sequence may be repeated. If the total number of cycles to form the desired thickness has been completed, the dielectric film containing the iridium layer may optionally be annealed.

The thickness of an iridium layer formed by atomic layer deposition may be determined by a fixed growth rate for the pulsing periods and precursors used, set at a value such as M nm/cycle, dependent upon the number of cycles of the iridium sequence. For a desired iridium layer thickness, d, in an application such as forming a gate of a MOS transistor, the ALD process is repeated for d/M total cycles. Once the d/M cycles have completed, no further ALD processing for the iridium layer may be required.

A conductive layer containing iridium may be used in various embodiments as electrodes, gates, and direct contacts to a dielectric layer containing zirconium oxide for a wide variety of electronic devices. In an embodiment, iridium of the conductive layer contacts the zirconium oxide film. In an embodiment, the conductive layer may be formed substantially as an iridium metal layer.

Alternatively, the conductive layer containing iridium may be formed containing an iridium oxide layer. In an embodiment, an iridium metal may be deposited by atomic layer deposition followed by exposure to oxygen to form an iridium metal layer having a conductive iridium oxide layer disposed on it. In an embodiment, an iridium metal may be deposited by atomic layer deposition to have a thickness such that its deposition followed by exposure to oxygen effectively converts the iridium layer to a conductive iridium oxide layer. In an embodiment, a conductive layer containing iridium may be formed substantially as a conductive iridium oxide layer. The conductive iridium oxide formed may be stoichiometric. The conductive iridium oxide formed may be non-stoichiometric. The conductive iridium oxide formed may be a combination of stoichiometric and non-stoichiometric iridium oxide. In an embodiment, a conductive iridium oxide layer may be formed on and contacting a zirconium oxide film.

After fabricating a structure having a dielectric film containing a zirconium oxide coupled to a conductive layer having a conductive iridium-based layer, the process for constructing a device having such a structure may be completed. In an embodiment, completion of the device includes completing the formation of a transistor. In an embodiment, completion of the device includes completing the formation of a capacitor. Alternatively, completing the process includes completion of a memory device having an array with access transistors formed with gate dielectrics containing atomic layer deposited zirconium oxide film coupled to an iridium-based conductor layer formed using atomic layer deposition. In an embodiment, a fabrication process includes the formation of an electronic system including an information handling device that uses electronic devices with dielectric films containing an atomic layer deposited zirconium oxide film contacting an atomic layer deposited iridium-based conductive layer.

Embodiments for methods having elements similar to the embodiment of FIG. 1 may include numerous permutations for forming a dielectric layer containing a zirconium oxide film and a conductive layer having a conductive iridium-based layer. In an embodiment, the dielectric layer includes substantially a zirconium oxide. The zirconium oxide film may be structured as one or more monolayers. In an embodiment, a dielectric layer containing a zirconium oxide film may include other dielectric layers. In an embodiment, a dielectric layer contains a zirconium oxide film and a non-zirconium oxide in which contact to a conductive layer containing iridium is configured with the zirconium oxide layer contacting the conductive layer. The conductive layer may be formed substantially of iridium. Alternatively, the conductive layer may be formed substantially of conductive iridium oxide. The iridium-based conductive layer may be configured substantially of iridium metal layer and conductive iridium oxide. The iridium-based conductive layer may be structured as one or more monolayers. The zirconium oxide and the iridium may be formed by atomic layer deposition. Iridium oxide may be formed as a combination of forming one or more monolayers of iridium by atomic layer deposition and exposing the iridium to oxygen at appropriate temperatures. Additionally, embodiments may be implemented to form transistors, capacitors, memory devices, and other electronic devices including information handling devices.

Figure 2:
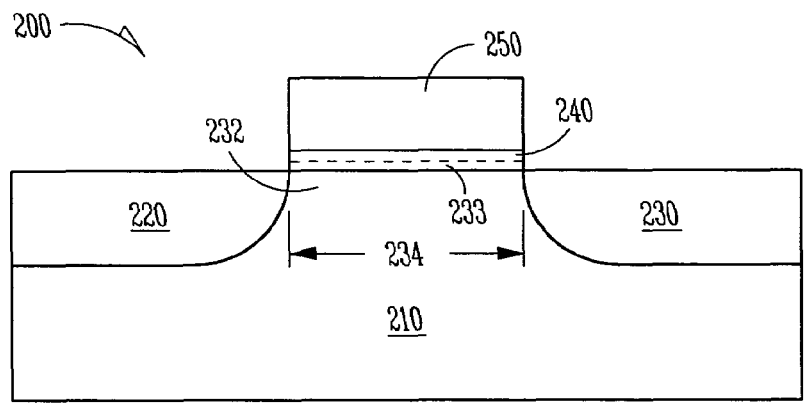
FIG. 2 shows an embodiment of a configuration of a transistor having an iridium/zirconium oxide structure.

An embodiment of a transistor 200 having an iridium-based layer and a zirconium oxide layer is depicted in FIG. 2 and may be constructed by forming a source region 220 and a drain region 230 in a silicon-based substrate 210 where source and drain regions 220, 230 are separated by a body region 232. Body region 232 defines a channel having a channel length 234. A gate dielectric 240 may be disposed on substrate 210, with gate dielectric 240 formed as a dielectric layer containing zirconium oxide. Gate dielectric 240 may be realized as a dielectric layer formed substantially of zirconium oxide. Gate dielectric 240 may be a dielectric stack containing at least one zirconium oxide film and one or more layers of insulating material other than a zirconium oxide film. The zirconium oxide may be structured as one or more monolayers. An embodiment of a zirconium oxide film may be formed by atomic layer deposition.

A gate 250 may be formed over and contact gate dielectric 240. In an embodiment, gate 250 contains iridium-based material. In an embodiment, gate 250 may be formed substantially of an iridium metal. Alternatively, gate 250 may be formed substantially of conductive iridium oxide. Gate 250 may be formed of iridium metal and conductive iridium oxide. A conductive iridium-based layer may be structured as one or more monolayers. An embodiment of an iridium-based layer may be formed using atomic layer deposition.

An interfacial layer 233 may form between body region 232 and gate dielectric 240. In an embodiment, interfacial layer 233 may be limited to a relatively small thickness compared to gate dielectric 240, or to a thickness significantly less than gate dielectric 240 as to be effectively eliminated. Forming the substrate and the source and drain regions may be performed using standard processes known to those skilled in the art. Additionally, the sequencing of the various elements of the process for forming a transistor may be conducted with fabrication processes known to those skilled in the art. In an embodiment, gate dielectric 240 may be realized as a gate insulator in a silicon CMOS. Use of a gate dielectric containing zirconium oxide contacted by a conductive layer containing iridium is not limited to silicon based substrates, but may be used with a variety of semiconductor substrates.

Figure 3:
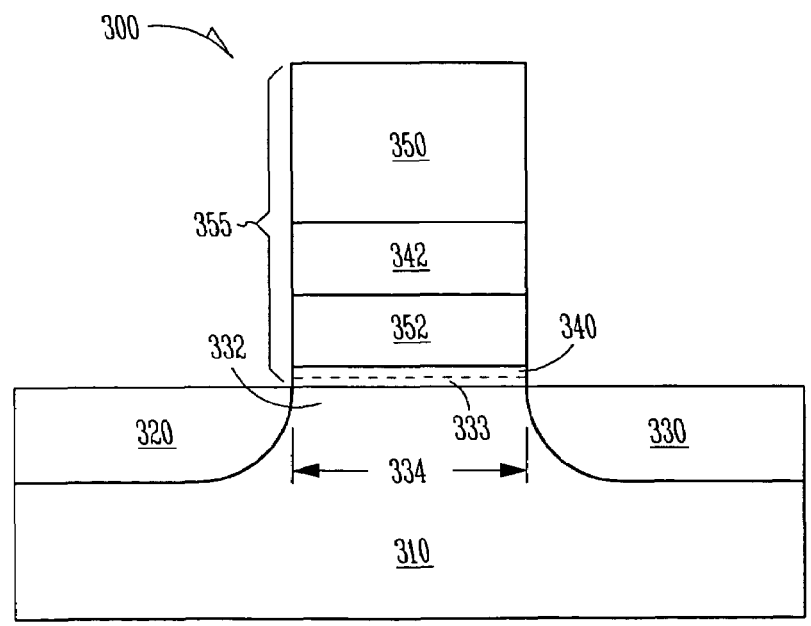
FIG. 3 shows an embodiment of a configuration of a floating gate transistor having an iridium/zirconium oxide structure.

FIG. 3 shows an embodiment of a configuration of a transistor 300 having a dielectric structured with one or more monolayers of a zirconium oxide film coupled to an iridium-based conductive layer, where the iridium-based conductive layer is structured as one or more monolayers. The zirconium oxide film and the iridium-based conductive layer may be formed using atomic layer deposition techniques. Transistor 300 may include a silicon-based substrate 310 with a source 320 and a drain 330 separated by a body region 332. Body region 332 between source 320 and drain 330 defines a channel region having a channel length 334. Located above body region 332 is a stack 355 including a gate dielectric 340, a floating gate 352, a floating gate dielectric 342, and a control gate 350. An interfacial layer 333 may form between body region 332 and gate dielectric 340. In an embodiment, interfacial layer 333 may be limited to a relatively small thickness compared to gate dielectric 340, or to a thickness significantly less than gate dielectric 340 as to be effectively eliminated.

In an embodiment, gate dielectric 340 includes a dielectric containing an atomic layer deposited zirconium oxide film formed in embodiments similar to those described herein. Gate dielectric 340 may be realized as a dielectric layer formed substantially of zirconium oxide. Gate dielectric 340 may be a dielectric stack containing at least one zirconium oxide film and one or more layers of insulating material other than an zirconium oxide film. In an embodiment, floating gate 352 may be formed over and contact gate dielectric 340. Floating gate 352 may contain iridium-based material. In an embodiment, floating gate 352 may be formed substantially of iridium metal. Alternatively, floating gate 352 may be formed substantially of conductive iridium oxide. Floating gate 352 may be formed substantially of iridium metal and conductive iridium oxide.

In an embodiment, floating gate dielectric 342 includes a dielectric containing an atomic layer deposited zirconium oxide film formed in embodiments similar to those described herein. Floating gate dielectric 342 may be realized as a dielectric layer formed substantially of zirconium oxide. Floating gate dielectric 342 may be a dielectric stack containing at least one zirconium oxide film and one or more layers of insulating material other than a zirconium oxide film. In an embodiment, control gate 350 may be formed over and contact floating gate dielectric 342. In an embodiment, control gate 350 may contain iridium-based material. In an embodiment, control gate 350 may be formed substantially of iridium metal. Alternatively, control gate 350 may be formed substantially of conductive iridium oxide. Control gate 350 may be formed substantially of iridium metal and conductive iridium oxide.

Alternatively, both gate dielectric 340 and floating gate dielectric 342 may be formed as dielectric layers containing a zirconium oxide film structured as one or more monolayers. In an embodiment, control gate 350 may be formed containing an iridium-based layer structured as one or more monolayers. In an embodiment, floating gate 352 may be formed containing an iridium-based layer structured as one or more monolayers. In an embodiment, control gate 350 and floating gate 352 may be formed containing an iridium-based layer structured as one or more monolayers. In an embodiment, the iridium-based layer may be formed substantially of an iridium metal structured as one or more monolayers. The iridium-based layer may be formed substantially of a conductive iridium oxide structured as one or more monolayers. Alternatively, the iridium-based layer may be formed substantially of an iridium metal structured as one or more monolayers and a conductive iridium oxide structured as one or more monolayers. Floating gate 352, control gate 350, gate dielectric 340, and floating gate dielectric 342 may be realized by embodiments similar to those described herein, with the remaining elements of the transistor 300 formed using processes known to those skilled in the art.

In an embodiment, gate dielectric 340 forms a tunnel gate insulator and floating gate dielectric 342 forms an inter-gate insulator in flash memory devices, where gate dielectric 340, floating gate dielectric 342, or gate dielectric 340 and floating gate dielectric 342 may include a zirconium oxide film structured as one or more monolayers. Control gate 350, floating gate 352, or control gate 350 and floating gate 352 may be iridium-based films structured as one or more monolayers. Such structures are not limited to silicon based substrates, but may be used with a variety of semiconductor substrates.

Figure 4:
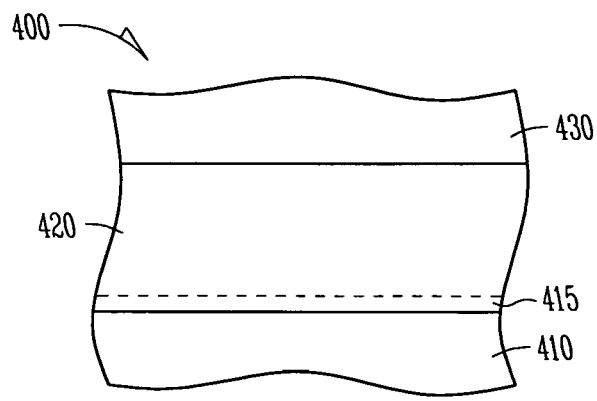
FIG. 4 shows an embodiment of a configuration of a capacitor having a capacitor dielectric having a zirconium oxide film with the zirconium oxide film structured as one or more monolayers and having an electrode contacting the capacitor dielectric, where the electrode includes a conductive layer having an iridium-based conductive layer with the iridium-based conductive layer structured as one or more monolayers.

Embodiments of a zirconium oxide film structured as one or more monolayers coupled to an iridium-based conductive layer, where the iridium-based conductive layer is structured as one or more monolayers, may also be applied to capacitors in various integrated circuits, memory devices, and electronic systems. In an embodiment for a capacitor 400 illustrated in FIG. 4, a method includes forming a first conductive layer 410, forming a dielectric layer 420 containing a zirconium oxide film structured as one or more monolayers on first conductive layer 410, and forming a second conductive layer 430 on dielectric layer 420. Dielectric layer 420, containing a zirconium oxide film, may be formed using various embodiments described herein. Dielectric layer 420 may be realized as a dielectric layer formed substantially of zirconium oxide. Dielectric layer 420 may be a dielectric stack containing at least one zirconium oxide film and one or more layers of insulating material other than a zirconium oxide film. An interfacial layer 415 may form between first conductive layer 410 and dielectric layer 420. In an embodiment, interfacial layer 415 may be limited to a relatively small thickness compared to dielectric layer 420, or to a thickness significantly less than dielectric layer 420 as to be effectively eliminated.

In an embodiment, second conductive layer 430 may contain an iridium-based layer structured as one or more monolayers. In an embodiment, first conductive layer 410 may contain an iridium-based layer structured as one or more monolayers. In an embodiment, second conductive layer 430 and first conductive layer 410 may contain an iridium-based layer structured as one or more monolayers. In an embodiment, the iridium-based layer may be formed substantially of an iridium metal. In an embodiment, the iridium-based layer may be formed substantially of a conductive iridium oxide. Alternatively, the iridium-based layer may be formed of a metal iridium layer and a conductive iridium oxide layer. Second conductive layer 430, first conductive layer 410, or second conductive layer 430 and first conductive layer 410 may be formed using various embodiments described herein. Embodiments for a zirconium oxide film structured as one or more monolayers coupled to an iridium-based conductive layer, where the iridium-based conductive layer is structured as one or more monolayers, include, but are not limited to, a capacitor in a DRAM and capacitors in analog, radio frequency (RF), and mixed signal integrated circuits. Mixed signal integrated circuits may operate with digital and analog signals.

Various embodiments for a dielectric film containing a zirconium oxide film structured as one or more monolayers coupled to an iridium-based conductive layer, where the iridium-based conductive layer is structured as one or more monolayers, may provide for enhanced device performance by providing devices with reduced leakage current. Such improvements in leakage current characteristics may be attained by forming one or more layers of a zirconium oxide in a nanolaminate structure with other metal oxides, non-metal-containing dielectrics, or combinations thereof. The transition from one layer of the nanolaminate to another layer of the nanolaminate provides disruption to a tendency for an ordered structure in the nanolaminate stack. The term "nanolaminate" means a composite film of ultra thin layers of two or more materials in a layered stack. Typically, each layer in a nanolaminate has a thickness of an order of magnitude in the nanometer range. Further, each individual material layer of the nanolaminate may have a thickness as low as a monolayer of the material or as high as 20 nanometers. In an embodiment, with $MO_x$ representing a metal oxide in which M represents a metal other than zirconium, a $ZrO_x/MO_x$ nanolaminate may contain alternating layers of a $ZrO_x$ and $MO_x$.

Figure 5:
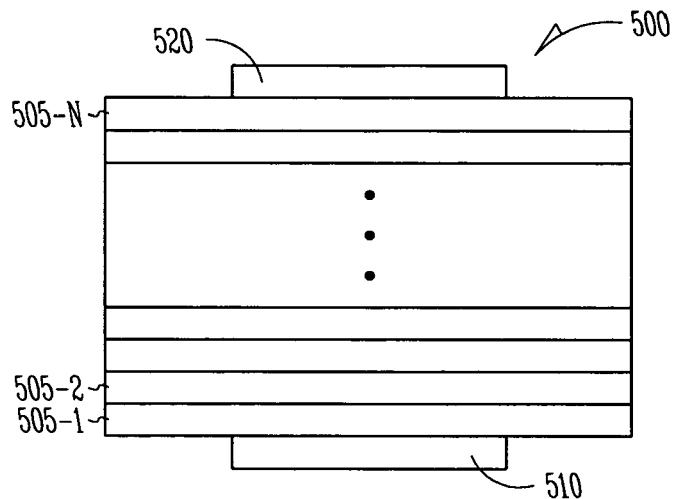
FIG. 5 depicts an embodiment of a dielectric layer including a nanolaminate having at least one zirconium oxide film structured as one or more monolayers coupled to a conductive layer having an iridium-based conductive layer, where the iridium-based conductive layer is structured as one or more monolayers.

FIG. 5 depicts a nanolaminate structure 500 for an embodiment of a dielectric structure including a zirconium oxide film structured as one or more monolayers coupled to an iridium-based conductive layer, where the iridium-based conductive layer is structured as one or more monolayers. Nanolaminate structure 500 includes a plurality of layers 505-1, 505-2 to 505-N, where at least one layer contains a zirconium oxide film structured as one or more monolayers. The other layers may be insulating nitrides, insulating oxynitrides, and other dielectric materials such as insulating metal oxides. The sequencing of the layers depends on the application. The effective dielectric constant associated with nanolaminate structure 500 is that attributable to N capacitors in series, where each capacitor has a thickness defined by the thickness and composition of the corresponding layer. By selecting each thickness and the composition of each layer, a nanolaminate structure can be engineered to have a predetermined dielectric constant.

In an embodiment, nanolaminate structure 500 contains conductive contacts 510 and 520. Conductive contact 520 may contain an iridium-based layer structured as one or more monolayers. Conductive contact 510 may contain an iridium-based layer structured as one or more monolayers. Conductive contacts 520 and 510 may contain an iridium-based layer structured as one or more monolayers. In an embodiment, the iridium-based layer may be configured substantially of an iridium metal. In an embodiment, the iridium-based layer may be configured substantially of a conductive iridium oxide. Alternatively, the iridium-based layer may be configured as a combination of iridium metal and conductive iridium oxide. In an embodiment, one or more of conductive contact 520 or conductive contact 510, containing an iridium-based layer, contact layers 505-N and 505-1, respectively, where at least one of layers 505-1 or 505-N includes a zirconium oxide film structured as one or more monolayers. Embodiments for structures such as nanolaminate structure 500 may be used as nanolaminate dielectrics in NROM flash memory devices as well as other integrated circuits. In an embodiment, a layer of the nanolaminate structure 500 is used to store charge in the NROM device. The charge storage layer of a nanolaminate structure 500 in an NROM device may be a silicon oxide layer.

Transistors, capacitors, and other devices having dielectric films containing atomic layer deposited zirconium oxide film in which the dielectric film contacts a conductive layer having an iridium-based layer formed using atomic layer deposition may be implemented into memory devices and electronic systems including information handling devices. Further, embodiments of electronic devices may be realized as integrated circuits. Embodiments of information handling devices may include wireless systems, telecommunication systems, and computers.

Figure 6:
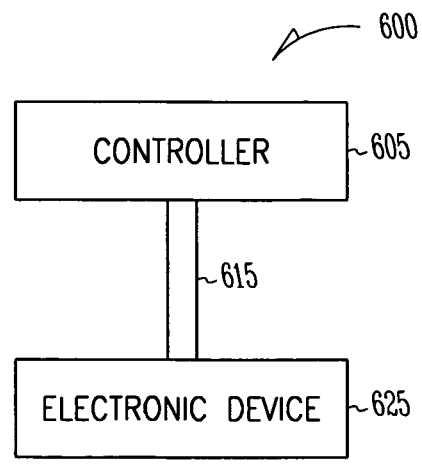
FIG. 6 is a simplified diagram for an embodiment of a controller coupled to an electronic device, in which at least one of the controller or electronic device includes an iridium/zirconium oxide structure.

FIG. 6 illustrates a block diagram for an electronic system 600 having one or more devices having a dielectric structure including a zirconium oxide film structured as one or more monolayers coupled to an iridium-based conductive layer, where the iridium-based conductive layer is structured as one or more monolayers. Electronic system 600 includes a controller 605, a bus 615, and an electronic device 625, where bus 615 provides electrical conductivity between controller 605 and electronic device 625. In various embodiments, controller 605 may include an embodiment of a zirconium oxide film coupled to an iridium-based conductive layer. In various embodiments, electronic device 625 may include an embodiment of a zirconium oxide film coupled to an iridium-based conductive layer. In various embodiments, controller 605 and electronic device 625 may include embodiments of a zirconium oxide film coupled to an iridium-based conductive layer. Electronic system 600 may include, but is not limited to, fiber optic systems, electro-optic systems, and information handling systems such as wireless systems, telecommunication systems, and computers.

Figure 7:
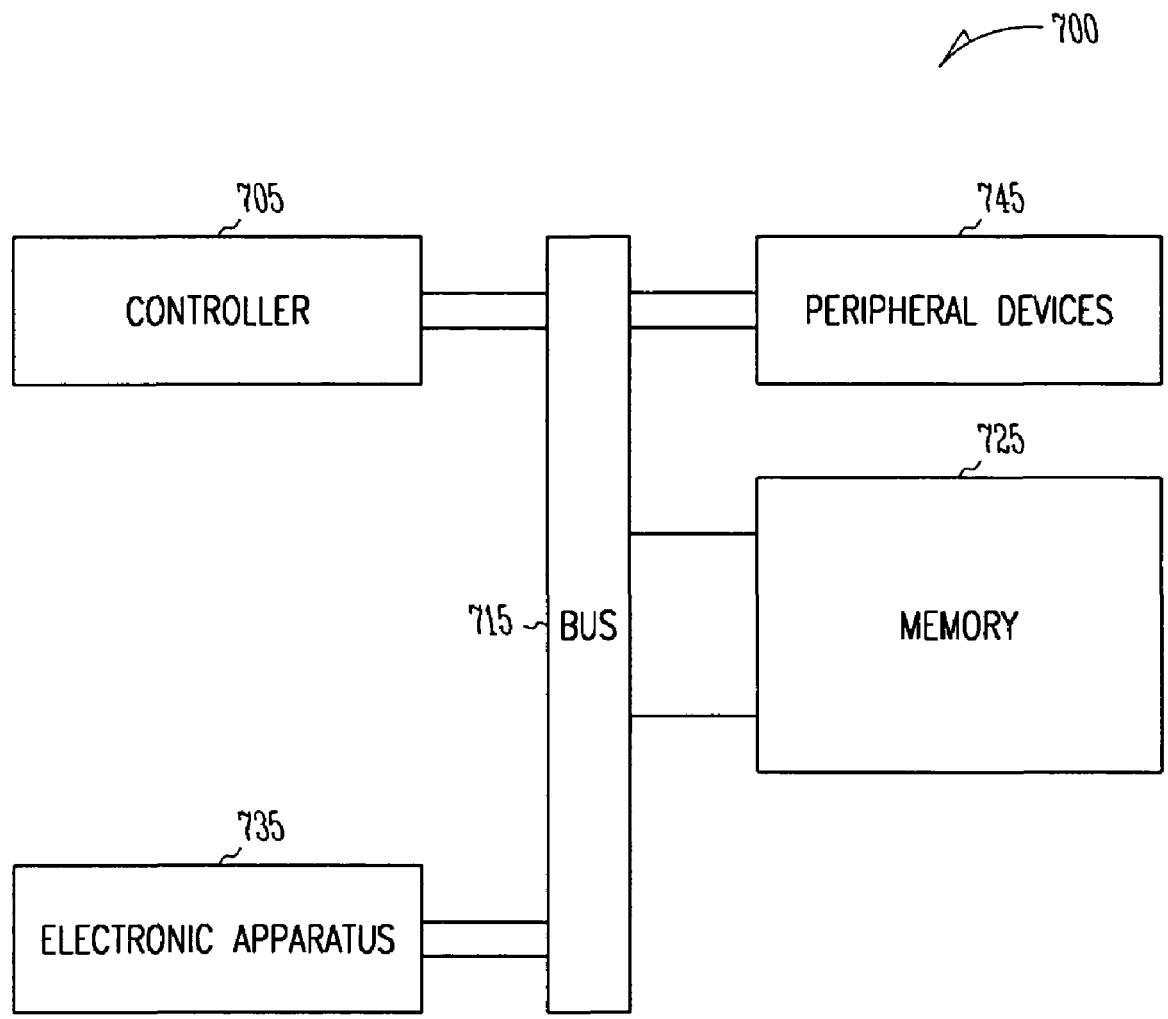
FIG. 7 illustrates a diagram for an embodiment of an electronic system having one or more devices with an iridium/zirconium oxide structure.

FIG. 7 depicts a diagram of an embodiment of a system 700 having a controller 705 and a memory 725. Controller 705 may include a zirconium oxide film structured as one or more monolayers coupled to an iridium-based conductive layer, where the iridium-based conductive layer is structured as one or more monolayers. Memory 725 may include a zirconium oxide film structured as one or more monolayers coupled to an iridium-based conductive layer, where the iridium-based conductive layer is structured as one or more monolayers. Controller 705 and memory 725 may include a zirconium oxide film structured as one or more monolayers coupled to an iridium-based conductive layer, where the iridium-based conductive layer is structured as one or more monolayers. System 700 also includes an electronic apparatus 735 and a bus 715, where bus 715 provides electrical conductivity between controller 705 and electronic apparatus 735, and between controller 705 and memory 725. Bus 715 may include an address, a data bus, and a control bus, each independently configured. Alternatively, bus 715 may use common conductive lines for providing one or more of address, data, or control, the use of which is regulated by controller 705. In an embodiment, electronic apparatus 735 may be additional memory configured in a manner similar to memory 725. An embodiment may include an additional peripheral device or devices 745 coupled to bus 715. In an embodiment, controller 705 is a processor. One or more of controller 705, memory 725, bus 715, electronic apparatus 735, or peripheral devices 745 may include an embodiment of a dielectric layer having a zirconium oxide film structured as one or more monolayers coupled to an iridium-based conductive layer, where the iridium-based conductive layer is structured as one or more monolayers. System 700 may include, but is not limited to, information handling devices, telecommunication systems, and computers.

Peripheral devices 745 may include displays, additional storage memory, or other control devices that may operate in conjunction with controller 705. Alternatively, peripheral devices 745 may include displays, additional storage memory, or other control devices that may operate in conjunction with controller 705, memory 725, or controller 705 and memory 725.

Memory 725 may be realized as a memory device containing a zirconium oxide film structured as one or more monolayers coupled to an iridium-based conductive layer, where the iridium-based conductive layer is structured as one or more monolayers. The iridium/zirconium oxide structure may be formed in a cell of a memory array. The iridium/zirconium oxide structure may be formed in a capacitor in a cell of a memory array. The iridium/zirconium oxide structure may be formed in a transistor in a cell of a memory array. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as other emerging DRAM technologies.

Embodiments of an electronic apparatus and embodiments for methods of forming the electronic apparatus include a conductive layer having an iridium-based layer, where the conductive layer is disposed on a dielectric layer containing zirconium oxide. In various embodiments, each of the zirconium oxide layer and the iridium-based layer may be structured as one or more monolayers. In various embodiments, each of the iridium-based layer and the zirconium oxide layer may be formed using atomic layer deposition. Embodiments may include structures and methods to form such structures for capacitors, transistors, memory devices, and electronic systems.

Although specific embodiments have been illustrated and described herein, it will be appreciated by those of ordinary skill in the art that any arrangement that is calculated to achieve the same purpose may be substituted for the specific embodiments shown. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description.

What is claimed is:

1. A method comprising:
forming a dielectric layer containing a zirconium oxide film including forming the zirconium oxide film by a monolayer or partial monolayer sequencing process; inserting lithium into the zirconium oxide film by ion implantation of the lithium; and
forming a conductive layer containing an iridium-based layer including forming the iridium-based layer using the monolayer or partial monolayer sequencing process, the conductive layer formed on the dielectric layer.

2. The method of claim 1, wherein forming a conductive layer containing an iridium-based layer includes forming the conductive layer such that iridium contacts the zirconium oxide film.

3. The method of claim 1, wherein forming the dielectric layer includes forming the dielectric layer on silicon-based substrate and forming the dielectric layer having a non-zirconium oxide layer such that the conductive layer containing the iridium-based layer contacts the zirconium oxide film.

4. The method of claim 1, wherein inserting lithium into the zirconium oxide film includes inserting the lithium to provide a lithium to zirconium ratio less than 0.10.

5. The method of claim 1, wherein inserting lithium into the zirconium oxide film includes inserting the lithium to provide a lithium to zirconium ratio ranging from about 0.005 to about 0.035.

6. The method of claim 1, wherein inserting lithium into the zirconium oxide film includes inserting the lithium to provide a lithium to zirconium ratio ranging from about 0.04 to about 0.1.

7. The method of claim 1, wherein forming a conductive layer includes forming the conductive layer substantially of iridium metal.

8. The method of claim 1, wherein forming a conductive layer includes forming the conductive layer substantially of conductive iridium oxide.

9. The method of claim 1, wherein forming the iridium-based layer includes using an iridium acetylacetonate precursor in an atomic layer deposition to form the iridium-based layer.

10. The method of claim 1, wherein forming the zirconium oxide film includes using a tetrakis(diethylamino)zirconium precursor.

11. The method of claim 1, wherein forming the zirconium oxide film includes using a zirconium tertiary-butoxide precursor.

12. The method of claim 1, wherein forming the zirconium oxide film includes using a zirconium halide precursor.

13. The method of claim 1, wherein forming a conductive layer includes forming the conductive layer as a gate of a transistor having the dielectric layer as a gate insulator.

14. The method of claim 1, wherein forming a conductive layer includes forming the conductive layer as a gate of a CMOS transistor having the dielectric layer as a gate insulator.

15. The method of claim 1, wherein forming a conductive layer includes forming the conductive layer as an electrode of a capacitor and forming the dielectric layer as a capacitor dielectric of the capacitor.

16. The method of claim 1, wherein the method includes forming the dielectric layer and the conductive layer in a memory device.

17. The method of claim 1, wherein the method includes forming a conductive path to the conductive layer to provide a signal to the conductive layer to operate in an electronic system.

18. A method comprising:
forming a first electrode on a substrate;
forming a dielectric layer containing a zirconium oxide film including forming the zirconium oxide film by atomic layer deposition and inserting lithium into the zirconium oxide film by ion implantation of the lithium, the dielectric layer disposed on and contacting the first electrode; and forming a second electrode on and contacting the dielectric layer, wherein forming the second electrode includes forming the second electrode as a conductive layer containing an iridium-based layer including forming the iridium-based layer using atomic layer deposition.

19. The method of claim 18, wherein the method includes forming both the first electrode and the second electrode as conductive layers containing an iridium-based layer.

20. The method of claim 18, wherein forming the second electrode as a conductive layer containing an iridium-based layer includes forming iridium contacting the zirconium oxide film.

21. The method of claim 18, wherein forming the zirconium oxide film includes inserting hydrogen into the zirconium oxide film.

22. The method of claim 18, wherein inserting lithium into the zirconium oxide film includes inserting the lithium to provide a lithium to zirconium ratio less than 0.10.

23. The method of claim 18, wherein inserting lithium into the zirconium oxide film includes inserting the lithium to provide a lithium to zirconium ratio ranging from about 0.04 to about 0.1.

24. The method of claim 18, wherein forming the iridium-based layer includes forming the iridium-based layer substantially of iridium metal.

25. The method of claim 18, wherein forming the iridium-based layer includes forming the iridium-based layer substantially of conductive iridium oxide.

26. The method of claim 18, wherein forming the iridium-based layer using atomic layer deposition includes using an iridium acetylacetonate precursor in the atomic layer deposition.

27. A method comprising;
forming a source and a drain separated by a channel;
forming a dielectric layer containing a zirconium oxide film including forming the zirconium oxide film by atomic layer deposition and inserting lithium into the zirconium oxide film by ion implantation of the lithium, the dielectric layer formed above the channel; and
forming a gate containing an iridium-based layer including forming the iridium-based layer using atomic layer deposition, the gate formed on the dielectric layer.

28. The method of claim 27, wherein forming a dielectric layer containing a zirconium oxide film includes forming the dielectric layer as a gate dielectric contacting the channel.

29. The method of claim 27, wherein forming a dielectric layer containing a zirconium oxide film includes forming the dielectric layer on and contacting a floating gate.

30. The method of claim 29, wherein the method includes forming the floating gate as a conductive layer containing an iridium-based layer.

31. The method of claim 27, wherein forming the zirconium oxide film includes inserting potassium into the zirconium oxide film.

32. The method of claim 27, wherein inserting lithium into the zirconium oxide film includes inserting the lithium to provide a lithium to zirconium ratio less than 0.10.

33. The method of claim 27, wherein inserting lithium into the zirconium oxide film includes inserting the lithium to provide a lithium to zirconium ratio ranging from about 0.04 to about 0.1.

34. The method of claim 27, wherein forming the iridium-based layer includes forming the iridium-based layer substantially of iridium metal.

35. The method of claim 27, wherein forming the iridium-based layer includes forming the iridium-based layer substantially of conductive iridium oxide.

36. The method of claim 27, wherein forming the iridium-based layer using atomic layer deposition includes using an iridium acetylacetonate precursor in the atomic layer deposition.

37. A method comprising:
forming a memory array including:
forming a dielectric layer containing a zirconium oxide film including forming the zirconium oxide film by atomic layer deposition and inserting lithium into the zirconium oxide film by ion implantation of the lithium; and
forming a conductive layer containing an iridium-based layer including forming the iridium-based layer using atomic layer deposition, the conductive layer formed on the dielectric layer in the memory array; and
forming circuitry to access the memory array.

38. The method of claim 37, wherein forming a conductive layer includes forming the conductive layer such that iridium contacts the zirconium oxide film.

39. The method of claim 37, wherein forming the dielectric layer includes forming the dielectric layer on silicon-based substrate and forming the dielectric layer having a non-zirconium oxide layer such that the conductive layer containing the iridium-based layer contacts the zirconium oxide film.

40. The method of claim 37, wherein inserting lithium into the zirconium oxide film includes inserting the lithium to provide a lithium to zirconium ratio less than 0.10.

41. The method of claim 37, wherein inserting lithium into the zirconium oxide film includes inserting the lithium to provide a lithium to zirconium ratio ranging from about 0.005 to about 0.035.

42. The method of claim 37, wherein inserting lithium into the zirconium oxide film includes inserting the lithium to provide a lithium to zirconium ratio ranging from about 0.04 to about 0.1.

43. The method of claim 37, wherein forming a conductive layer includes forming the conductive layer substantially of iridium metal.

44. The method of claim 37, wherein forming a conductive layer includes forming the conductive layer substantially of conductive iridium oxide.

45. The method of claim 37, wherein forming the iridium-based layer using atomic layer deposition includes using an iridium acetylacetonate precursor in the atomic layer deposition.

46. The method of claim 37, wherein forming a dielectric layer containing a zirconium oxide film includes forming the dielectric layer as a gate insulator of a transistor in a cell of the memory array, the transistor having the conductive layer as a gate contacting the dielectric layer.

47. The method of claim 37, wherein the method includes forming a flash memory device and forming the dielectric layer containing a zirconium oxide film as an inter-gate insulator of a transistor in the flash memory device, the transistor having the conductive layer as a control gate.

48. The method of claim 37, wherein forming a conductive layer includes forming the conductive layer as an electrode of a capacitor in a cell of the memory array and forming the dielectric layer containing a zirconium oxide film as a capacitor dielectric of the capacitor.

49. A method comprising:
providing a controller;
coupling an integrated circuit to the controller, wherein one or more of the controller or the integrated circuit includes a dielectric layer containing a zirconium oxide film, the dielectric layer contacting a conductive layer having an iridium-based conductive layer, wherein forming the dielectric layer contacting the conductive layer includes:
  forming the zirconium oxide film by atomic layer deposition;
  inserting lithium into the zirconium oxide film by ion implantation of the lithium; and
  forming the iridium-based conductive layer using atomic layer deposition.

50. The method of claim 49, wherein the dielectric layer contacting a conductive layer includes forming iridium in contact with the zirconium oxide film.

51. The method of claim 49, wherein forming the zirconium oxide film includes inserting hydrogen or potassium into the zirconium oxide film.

52. The method of claim 49, wherein inserting lithium into the zirconium oxide film includes inserting the lithium to provide a lithium to zirconium ratio less than 0.10.

53. The method of claim 49, wherein inserting lithium into the zirconium oxide film includes inserting the lithium to provide a lithium to zirconium ratio ranging from about 0.005 to about 0.035.

54. The method of claim 42, wherein inserting lithium into the zirconium oxide film includes inserting the lithium to provide a lithium to zirconium ratio ranging from about 0.04 to about 0.1.

55. The method of claim 49, wherein contacting a conductive layer having an iridium-based conductive layer includes the conductive layer formed substantially of iridium metal.

56. The method of claim 49, wherein contacting a conductive layer having an iridium-based conductive layer includes the conductive layer formed substantially of conductive iridium oxide.

57. The method of claim 49, wherein forming the iridium-based layer using atomic layer deposition includes using an iridium acetylacetonate precursor in the atomic layer deposition.

58. The method of claim 49, wherein coupling an integrated circuit to the controller includes coupling a memory device to the controller.

59. The method of claim 49, wherein providing a controller includes providing a processor.

60. The method of claim 49, wherein coupling an integrated circuit to the controller includes coupling a mixed signal integrated circuit, the mixed signal integrated circuit formed having the dielectric layer contacting the conductive layer.

61. The method of claim 49, wherein coupling an integrated circuit to the controller includes coupling a radio frequency integrated circuit, the radio frequency integrated circuit formed having the dielectric layer contacting the conductive layer.

62. The method of claim 49, wherein the method includes forming an information handling system.

63. An electronic device comprising:
  a dielectric layer in an integrated circuit, the dielectric layer containing a zirconium oxide film and a layer of insulating nitride, the zirconium oxide film including one or more of lithium, hydrogen, or potassium, the zirconium oxide film structured as one or more monolayers; and
  a conductive layer having an iridium-based conductive layer, the conductive layer contacting the zirconium oxide film, the iridium-based conductive layer structured as one or more monolayers.

64. The electronic device of claim 63, wherein the zirconium oxide layer includes lithium.

65. The electronic device of claim 64, wherein the zirconium oxide film includes a lithium to zirconium ratio of less than 0.10.

66. The electronic device of claim 64, wherein the zirconium oxide film includes a lithium to zirconium ratio ranging from about 0.04 to about 0.1.

67. The electronic device of claim 63, wherein the conductive layer is configured substantially of iridium metal.

68. The electronic device of claim 63, wherein the conductive layer is configured substantially of conductive iridium oxide.

69. The electronic device of claim 63, wherein the electronic device includes a transistor having the dielectric layer as a gate insulator of the transistor in the integrated circuit and the conductive layer as a gate of the transistor.

70. The electronic device of claim 63, wherein the electronic device includes a CMOS transistor having the dielectric layer as a gate insulator.

71. The electronic device of claim 63, wherein the electronic device includes a capacitor having the dielectric layer as a capacitor dielectric and the conductive layer as an electrode.

72. The electronic device of claim 63, wherein the dielectric layer includes a nanolaminate.

73. The electronic device of claim 63, wherein the electronic device includes a memory device having the dielectric layer and the conductive layer as memory cell components.

74. The electronic device of claim 63, wherein the electronic device includes a conductive path to the conductive layer to provide a signal to the conductive layer to operate in an electronic system.

* * * * *

UNITED STATES PATENT AND TRADEMARK OFFICE
CERTIFICATE OF CORRECTION

| | | |
|---|---|---|
| PATENT NO. | : 7,510,983 B2 | Page 1 of 1 |
| APPLICATION NO. | : 11/152759 | |
| DATED | : March 31, 2009 | |
| INVENTOR(S) | : Ahn et al. | |

It is certified that error appears in the above-identified patent and that said Letters Patent is hereby corrected as shown below:

In column 21, line 25, in Claim 54, delete "42," and insert -- 49, --, therefor.

Signed and Sealed this

Seventh Day of July, 2009

JOHN DOLL
*Acting Director of the United States Patent and Trademark Office*